US 6,180,475 B1

(12) United States Patent
Cheek et al.

(10) Patent No.: US 6,180,475 B1
(45) Date of Patent: *Jan. 30, 2001

(54) TRANSISTOR FORMATION WITH LOCAL INTERCONNECT OVERETCH IMMUNITY

(75) Inventors: Jon D. Cheek, Round Rock; Derick J. Wristers; H. Jim Fulford, both of Austin, all of TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/134,702

(22) Filed: Aug. 14, 1998

Related U.S. Application Data

(62) Division of application No. 08/996,648, filed on Dec. 23, 1997.

(51) Int. Cl.[7] ............... H01L 21/336; H01L 21/76
(52) U.S. Cl. ............... 438/305; 438/307; 438/433
(58) Field of Search .................. 438/305, 306, 438/307, 275, 296, 286, 433; 257/372

(56) References Cited

U.S. PATENT DOCUMENTS

| 4,753,901 | * | 6/1988 | Ellsworth et al. | 437/67 |
| 5,401,678 | * | 3/1995 | Jeong et al. | 437/44 |
| 5,559,368 | | 9/1996 | Hu et al. | 257/369 |
| 5,734,192 | * | 3/1998 | Sengle et al. | 257/506 |
| 5,831,305 | * | 11/1998 | Kim | 257/338 |

OTHER PUBLICATIONS

Stanley Wolf and Richard N. Tauber, *Silicon Processing for the VLSI Era, vol. 1—Process Technology*; pp. 210–226, 555–565; 1986.
Stanley Wolf and Richard N. Tauber, *Silicon Processing for the VLSI Era, vol. 2—Process Integration*; pp. 162–169, 318, 332–333, 354–361, 419–439; 1990.
Stanley Wolf and Richard N. Tauber, *Silicon Processing for the VLSI Era, vol. 3—The Submicron MOSFET*; pp. 367–407, 591–660; 1995.

* cited by examiner

Primary Examiner—John F. Niebling
Assistant Examiner—Neal Berezny
(74) Attorney, Agent, or Firm—Timothy M. Honeycutt

(57) ABSTRACT

An integrated circuit transistor and a method for making the same are provided. The transistor is resistant to junction shorts due to the overetch of local interconnect trenches. The transistor includes a source/drain region with a first junction and a second junction that is located deeper than the first junction in the portion of the active area susceptible to the overetch junction short phenomena. The second junction is established by ion implantation through a mask that is patterned to create an opening corresponding to the intersection of the layouts of the active area and the local interconnect trench. Using this method, the second junction is only established where needed to prevent shorting and does not impede transistor performance.

11 Claims, 7 Drawing Sheets

TRANSISTOR FORMATION WITH LOCAL INTERCONNECT OVERETCH IMMUNITY

This application is a divisional of application Ser. No. 08/996,648, filed Dec. 23, 1997.

BACKGROUND OF THE INVENTION

1. Field of the Invention

This invention relates generally to semiconductor processing, and more particularly, to an integrated circuit that has an overetch resistant local interconnect structure, and a method for making the same.

2. Description of the Related Art

Modern integrated circuits routinely contain millions of individual transistors and other electronic components. Most of the interconnections for the numerous individual transistors in a modern integrated circuit are provided via one or more metallization layers that serve as global interconnect levels. Each metallization layer is ordinarily deposited on the substrate of the integrated circuit as a single continuous layer that is thereafter patterned lithographically and etched to remove metal from areas where metal lines are not required.

In addition to the one or more metallization layers, modern integrated circuits also incorporate numerous routing-restricted interconnect levels commonly known as local interconnect ("LI"). LIs are used for short metallization runs such as those that locally interconnect gates and drains in NMOS and CMOS circuits and those that connect a given metallization layer to a particular structure in the integrated circuit.

A method frequently employed to form LI structures involves a damascene process in which the substrate containing the integrated circuit is coated with a layer of dielectric material that is lithographically patterned and etched to form trenches in the dielectric layer where the LI structures will be deposited. For LI structures interconnecting transistor components, the trenches must be formed in close proximity to the components of the transistors. For example, an LI structure intended to interconnect the source or drain of a transistor requires a trench to be formed in the overlying dielectric layer that extends down to the source or drain. If the LI structure is designed to interconnect with an overlying structure, such as a metallization layer, and if alignment of the photolithographic process used to pattern the trench is perfect or nearly perfect, the trench will be patterned and etched only over the source or drain. However, LI structures are frequently used to interconnect adjacent circuit structures. Such laterally routed LI structures must pass over at least one border between the active area of the strapped transistor and its surrounding isolation trench. In addition, photolithographic processes seldom achieve perfect alignment. Lateral routing and/or misalignment result in the frequent patterning and etching of LI trenches over not only the targeted transistor structure, such as the source or drain, but also over the isolation structures that border the transistor. Since the isolation structures are frequently composed of the same or a similar type of dielectric material that is being etched to form the LI trench, the etching process may attack the isolation structures surrounding the transistor and form voids that extend to the active area of the transistor. When the LI material is ultimately deposited in the trench, conducting material fills the void and shorts the junction. The result is lower yields.

In addition to lowering yields, the overetch problem may lead to wasted electrical testing steps. The problem stems from the fact that the shorted junctions may not occur uniformly across the surface of a given wafer. As a consequence, shorted junctions may arise in the operational transistors, but not in the test structures in the wafer. The defects in the operational transistors may not be detected during the initial electrical characterization tests which are normally performed only on the test structures. Such defects may only be detected during subsequent probe testing of the operational circuits on the wafer. The result is wasted processing time.

In conventional LI processing, control of the overetch problem is attempted through manipulation of the etching process. The disadvantage of this approach is that precise control of the etching process is difficult to achieve. This is due, in large part, to the fact that the design rules for a conventional LI trench etching process are based upon an anticipated average thickness for the dielectric layer, and any underlying layers, such as $TiSi_2$ and a $Si_3N_4$ or oxynitride etch stop layer. In practice, however, the actual thicknesses of these layers may be less than the anticipated norm. As a consequence the etch process may remove these layers and attack the underlying isolation structure before the etch cycle is completed.

Furthermore, there may be variations in the composition of the dielectric and underlying $TiSi_2$ and $Si_3N_4$ layers that may enable the etchant species to attack certain areas more aggressively than others and lead to overetch. The overetch problem is, as noted above, exacerbated by the fact that the dielectric layer and the underlying isolation structures are composed of the same or a related dielectric material. Consequently, once the etch stop layer is compromised, the etchant gases will readily attack the isolation structure.

The present invention is directed to overcoming or reducing one or more of the foregoing disadvantages.

SUMMARY OF THE INVENTION

In accordance with one aspect of the present invention, a method of fabricating an integrated circuit transistor in a substrate for connection to a local interconnect in a trench where the substrate has an active area is provided. The method includes the steps of forming a gate electrode on the substrate and forming a first source/drain region and a second source/drain region in the substrate. The first source/drain region has a first junction at a first depth in the substrate. A mask is applied to the substrate and patterned to create an opening defined by the intersection of the layouts of the active area and the trench. A dopant species is implanted through the opening to provide the first source/drain region with a second junction that is deeper than the first junction.

In accordance with another aspect of the present invention, a method of making a source/drain region in an integrated circuit transistor in a substrate for connection to a local interconnect in a trench where the substrate has an active area is provided. The method includes the steps of implanting a first dopant of a first dopant type into the active area to establish the source/drain region so that the source/drain region has a first junction at a first depth in the substrate. A mask is applied to the substrate and patterned to create an opening in the mask defined by the intersection of the layouts of the active area and the local interconnect trench. A second dopant of the first dopant type is implanted into the substrate through the opening to provide the source/drain region with a second junction that is deeper than the first junction.

In accordance with another aspect of the present invention, an integrated circuit transistor is provided. The integrated circuit transistor includes a semiconductor substrate that has an active area and a dielectric layer disposed on the substrate that has a local interconnect trench formed therein. A first source/drain region and a second source/drain region in the substrate are provided in the substrate and are laterally spaced to define a channel region in the substrate. The first source/drain region has a first junction that has a first depth and a second junction that has a second depth deeper than the first depth. The second junction is positioned at the intersection of the layout of the active area and the layout of the local interconnect trench. A gate electrode is coupled to the substrate over the channel region.

In accordance with still another aspect of the present invention, an integrated circuit transistor for connection to a local interconnect in a trench is provided. The integrated circuit transistor includes a semiconductor substrate that has an active area. A first source/drain region of a first dopant type is provided in the substrate A second source/drain region is provided in the substrate. The first and second source/drain regions are laterally spaced to define a channel region in the substrate. The first source/drain region has a first junction located at a first depth and a second junction located at a second depth deeper than the first depth in the active area. The second junction is formed by applying a mask to the substrate, patterning the mask to create an opening in the mask defined by the intersection of the layouts of the active area and the trench, and implanting a dopant species of the first dopant type into the substrate through the opening. A gate electrode is coupled to the substrate over the channel region.

In accordance with still another aspect of the present invention, a method of fabricating a local interconnect for a semiconductor device having a source/drain region of a first dopant type with a first junction depth in a substrate having an active area is provided. The method includes the steps of applying a mask to the semiconductor device and patterning the mask to create an opening defined by the intersection of the layouts of the active area and the trench. A dopant species of the first dopant type into the substrate through the opening to define a second junction for the source/drain region having a second depth greater than the first depth. A dielectric layer is applied to the substrate. The trench is formed in the dielectric layer. A conducting material is deposited in the trench.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
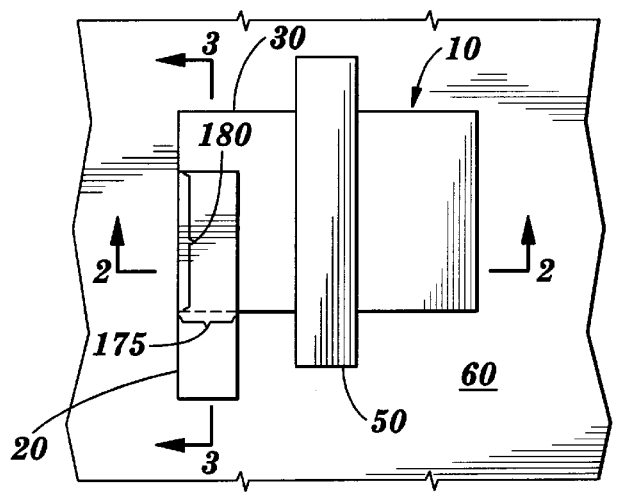
FIG. 1 is a plan view of an exemplary conventional MOSFET and local interconnect strap fabricated in accordance with a conventional fabrication process.
Figure 2:
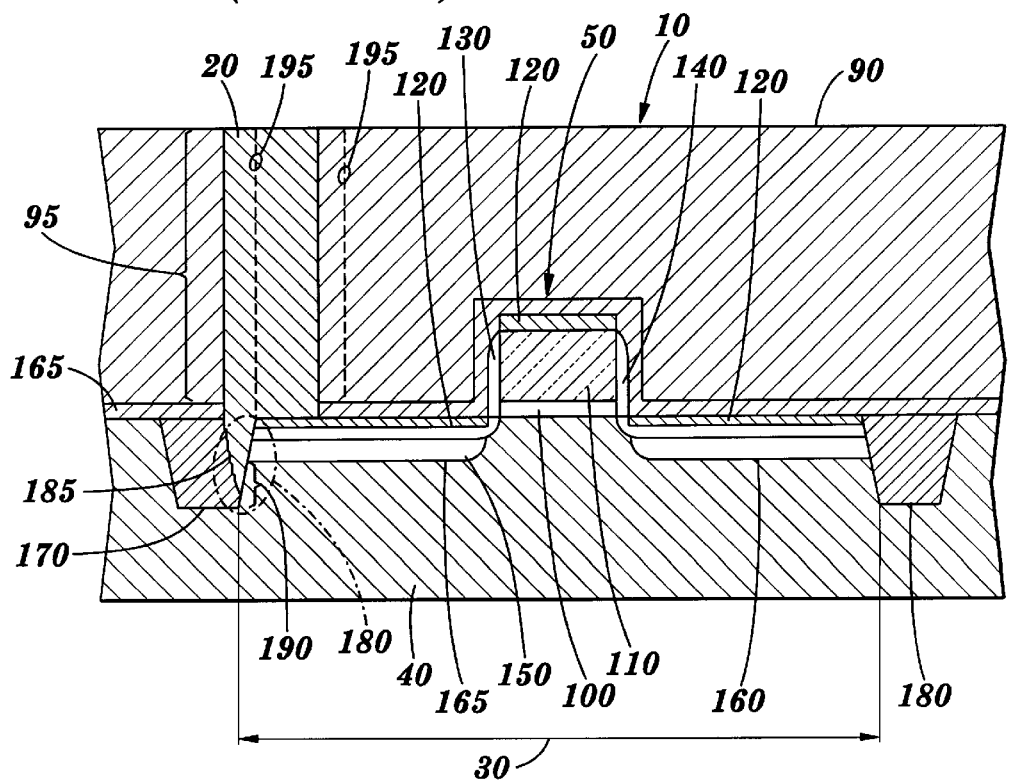
FIG. 2 is a cross-sectional view of FIG. 1 taken at section 2—2.
Figure 3:
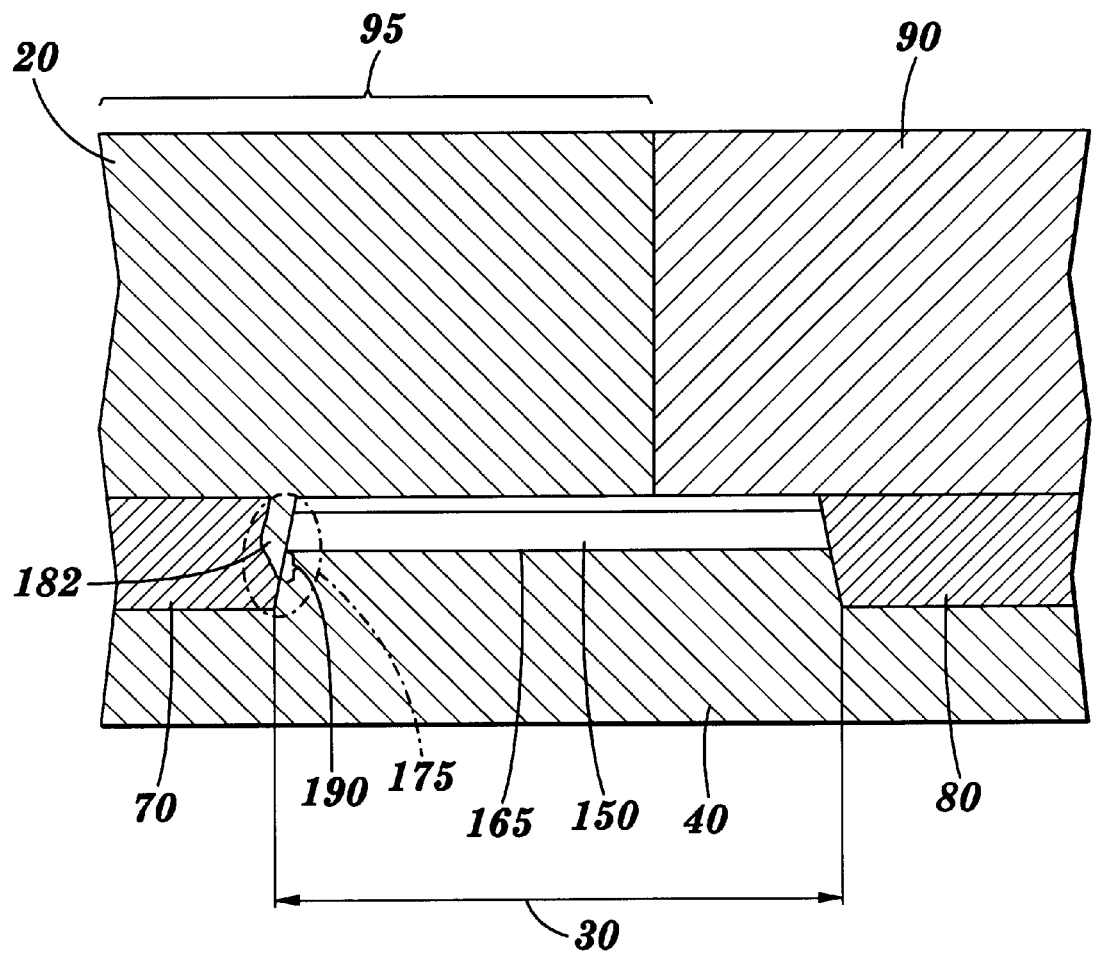
FIG. 3 is a cross-sectional view of FIG. 1 taken at section 3—3.

Turning now to the drawings, and in particular to FIGS. 1, 2, and 3, there is shown a conventional metal oxide semiconductor field effect transistor ("MOSFET") 10 that is provided with a local interconnect ("LI") strap 20 configured to interconnect the MOSFET 10 to an adjacent transistor (not shown). FIG. 1 is a plan view, and FIGS. 2 and 3 are cross-sectional views taken, respectively, at sections 2—2 and 3—3. The MOSFET 10 includes an active area 30 in a semiconductor substrate 40 and an overlying gate electrode 50. The MOSFET 10 is generally circumscribed by shallow trench isolation material 60 that is visible in FIGS. 2 and 3 as isolation trenches 70 and 80. The MOSFET 10 is covered by a dielectric layer 90 that is shown in FIGS. 2 and 3, but cut away in FIG. 1 to reveal the MOSFET 10. The LI strap 20 is deposited in a trench 95 in the dielectric layer 90. The dielectric layer 90 is typically composed of tetra-ethyl-ortho-silicate ("TEOS"), or some type of glass material, such as spin-on-glass ("SOG") or borophosphosilicate glass ("BPSG"). The gate electrode 50 is a stack consisting of a gate oxide layer 100 covered by a polysilicon layer 110 that is topped with a salicide layer 120 composed of a refractory metal material, such as $TiSi_2$. The gate electrode 50 is provided with sidewall spacers 130 and 140 that facilitate the formation of lightly doped source/drain regions 150 and 160. The source/drain region 150 is formed with a junction 165. Portions of the aforementioned $TiSi_2$ layer 120 occupy the upper regions of the source/drain regions 150 and 160. The MOSFET 10 is coated with an etch stop layer 170 of $Si_3N_4$.

The LI strap 20 is positioned in FIGS. 1, 2, and 3 to illustrate the aforementioned overetch problem. The LI strap 20 and the LI trench 95 are shown formed over borders (designated 175 and 180) between the active area 30 and the trench isolation material 60. The formation of the LI strap 20 and the trench 95 over the border 175 is a necessary by-product of the lateral routing character of the LI strap 20. The formation of the LI strap 20 and the trench 95 over the border 180 is the result of a slight photolithographic misalignment that commonly occurs in LI trench formation. The etch process used to form the trench 95 in the dielectric layer 90 resulted in an overetch that removed not only the etch stop 170, but also a significant portion of the isolation trench 70 at the borders 175 and 180 and extending below the junction 165 of the source/drain region 150. The void formed in the isolation trench 70 is filled with conducting material during the subsequent deposition of the LI strap 20, resulting in a spike 182 that shorts the junction 165 at the area designated 190. Contrast a hypothetically ideal placement for the LI strap 20 (denoted by the singly dashed lines 195 in FIG. 2) to interconnect the source/drain region 150 to some other structure. Note that the hypothetically ideal placement of the LI strap 20 for a lateral interconnect is such that the left border of the LI strap 20 is vertically aligned with the border 180, while the border 175 is still traversed.

Figure 4:
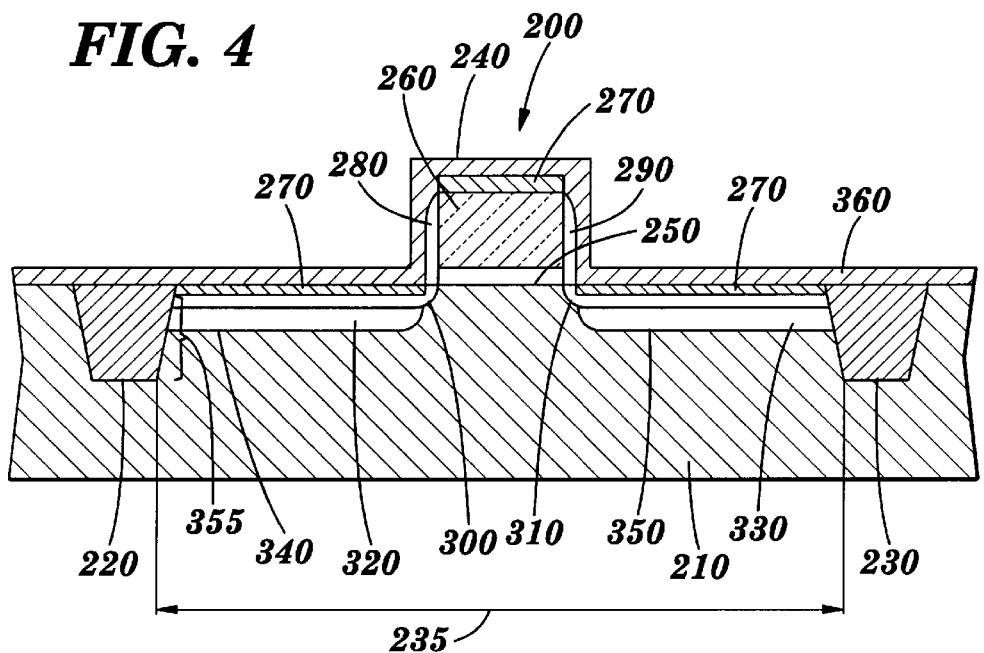
FIG. 4 is a cross-sectional view like FIG. 2 of an exemplary embodiment of an integrated circuit transistor fabricated in accordance with the present invention.

Referring now to FIGS. 4 through 13, and initially to FIG. 4, there is shown an exemplary embodiment of an integrated circuit transistor ("transistor") 200 and the process for making the same in accordance with the present invention. The transistor 200 may be an IGFET, a MOSFET, or other type of transistor and may be n-channel or p-channel. The transistor 200 is formed on a semiconductor substrate 210 which may be composed of n-doped, or p-doped silicon, silicon-on-insulator, or other suitable substrate materials. Isolation trenches 220 and 230 electrically isolate the transistor 200 from other structures in the substrate 210 and define an active area 235 for the transistor 200. The isolation trenches 220 and 230 may be fabricated using well known techniques to fabricate isolation trenches, such as, for example, shallow trench isolation and reflow, deep trench isolation, or other suitable trench isolation techniques. The isolation trenches 220 and 230 are advantageously composed of a suitable dielectric material, such as $SiO_2$ or other suitable dielectric trench isolation materials.

The transistor 200 includes a gate electrode 240 formed on the substrate 210. The gate electrode 240 includes a gate oxide layer 250 formed on the substrate 210, a conductor layer 260 formed on the gate oxide layer 250, and a salicide layer 270 formed on the conductor layer 260. The gate oxide layer 250 may be composed of $SiO_2$, or other materials suitable for gate oxide layers. The gate oxide layer 250 may be 30 to 500 Å thick and is advantageously 37 Å thick. The conductor layer 260 may be composed of a variety of conducting materials suitable for gate electrodes, such as, for example, amorphous silicon, polysilicon, aluminum, copper, or other conducting materials. Well known techniques for forming gate electrodes, such as CVD and anisotropic etching, may be used to fabricate the conductor layer 260. The conductor layer 260 may be 1500 to 2500 Å thick and is advantageously 1750 Å thick. The salicide layer 270 is formed to provide a suitable ohmic contact for any subsequent metallization. The salicide layer 270 is advantageously composed of a suitable material, such as, for example, $TiSi_2$, CoSi, or similar salicide materials, and is advantageously $TiSi_2$. The salicide layer 270 may be 600 to 800 Å thick, and is advantageously 700 Å thick. The salicide layer 270 is formed using well known CVD application, and RTA techniques. In this embodiment, the salicide layer 270 is also formed over the substrate 210 on either side of the gate electrode 240 and between the isolation trenches 220 and 230.

Implants to adjust the threshold voltage $V_T$ of the transistor 200 and to inhibit punchthrough may be performed. The energy and dosage for the $V_T$ adjust and punchthrough inhibitor implants will depend on the dopant species. For p-type dopants, such as boron, the dosage for the threshold voltage adjust implant may be 2E12 to 7E12 ions/cm$^2$ and is advantageously 7E12 ions/cm$^2$. The energy may be 10 to 30 keV and is advantageously 20 keV. For n-type dopants, such as phosphorus, the energy may be 30 to 70 keV and is advantageously 50 keV. For p-type dopants, such as boron, the dosage for the punchthrough inhibitor implant may be 1E12 to 1E13 ions/cm$^2$ and is advantageously 6E12 ions/cm$^2$. The energy may be 40 to 70 keV and is advantageously 50 keV. For n-type dopants, such as phosphorus, the energy may be 80 to 120 keV and is advantageously 100 keV.

The gate electrode 240 is provided with dielectric sidewall spacers 280 and 290. The sidewall spacers 280 and 290 may be composed of a suitable sidewall spacer material, such as, for example, $SiO_2$, $Si_3N_4$, or similar suitable sidewall spacer materials. Prior to formation of the sidewall spacers 280 and 290, the substrate 210 is ion implanted with a dopant species to form the lightly doped drain ("LDD") structures 300 and 310 that are self-aligned to the gate electrode 240. The energy and dosage of the LDD implant will depend upon the dopant type. In an exemplary embodiment for p-channel, the dopant is $BF_2$. The dosage may be 1E14 to 2E15 ions/cm$^2$ and is advantageously 1E15 ions/cm$^2$. The energy may be 5 to 30 keV and is advantageously 20 keV. Following formation of the sidewall spacers 280 and 290, a second ion implantation step is performed that is self-aligned to the sidewall spacers 280 and 290 to establish the source/drain regions 320 and 330. The phrase "source/drain region(s)" is used herein to describe a region that may serve as either a source or a drain. The person of ordinary skill in the art will appreciate that a source/drain region may function as a source or a drain depending upon whether it is connected to $V_{SS}$ or $V_{DD}$ during metallization. The source/drain region 320 is provided with a first junction 340 and the source/drain region 330 is also provided with a first junction 350. The energy and dosage of the S/D implant will depend upon the dopant type. In an exemplary embodiment, the dopant is $BF_2$. The dosage may be 2E12 to 5E15 ions/cm$^2$ and is advantageously 4E15 ions/cm$^2$. The energy may be 40 to 70 keV and is advantageously 60 keV. Like the $V_T$ and punchthrough implants, the energy of the S/D and LDD implants will be proportionately different for different species.

An etch stop layer 360 is applied over the transistor 200 to protect the gate electrode 240, and to a lesser extent the source/drain regions 320 and 330 from subsequent etching steps, such as the formation of LI strap openings or trenches to be described below. The etch stop layer 360 may be composed of silicon oxynitride, $Si_3N_4$, or other etch stop materials suitable to retard the activity of the etch process used to form the trench. The etch stop layer 360 may be 750 to 850 Å thick and is advantageously 800 Å thick.

Figure 5:
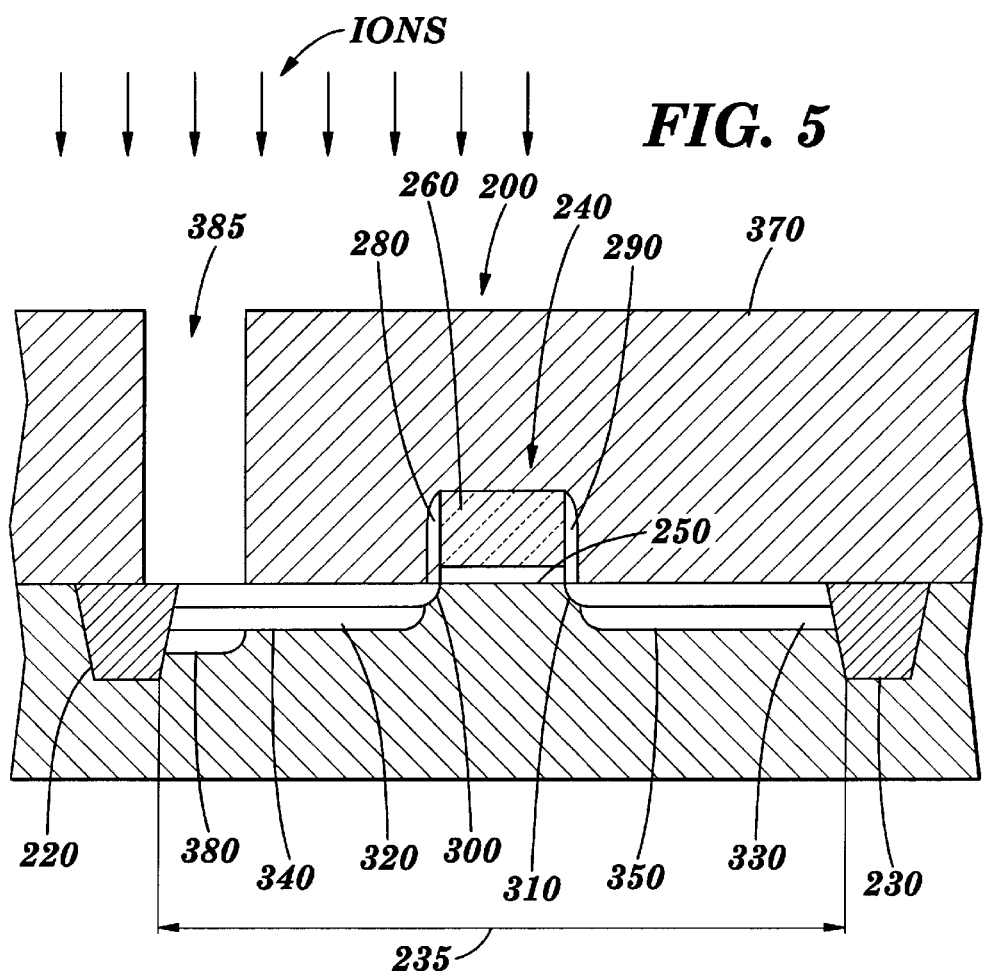
FIG. 5 is a cross-sectional view like FIG. 4 depicting ion implantation of the integrated circuit transistor through a mask layer in accordance with the present invention.
Figure 6:
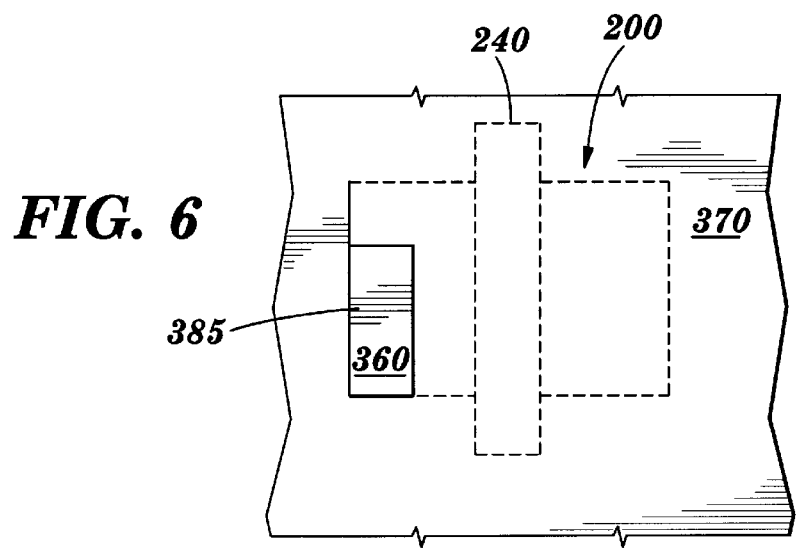
FIG. 6 is a plan view of the integrated circuit transistor of FIG. 5 showing the patterning of the mask layer in accordance with the present invention.

It is desirable to protect the transistor 200 from the aforementioned overetch problem. In this regard, an ion implant step is performed as shown in FIG. 5 to provide the source/drain region 320 with a second junction 380 that is deeper than the first junction 340 in the area susceptible to overetch. As illustrated in FIG. 5, the implant is performed prior to the formation of the salicide layer 270 and application of the etch stop layer 360 shown in FIG. 4. Prior to the implant, a mask layer 370 is applied over the transistor 200. The mask layer 370 is advantageously composed of well known photoresist materials and is applied using well known techniques for applying photoresist materials. Alternatively, the mask layer 370 may be a hard mask composed of oxide or nitride materials. The mask layer 370 is patterned to define an opening 385 that is formed in the mask layer 370 by well known photoresist developing and etching techniques. FIG. 6 shows a highly simplified plan view of the transistor 200 following application of the photoresist layer 370 and formation of the opening 385.

The photoresist is patterned so that the opening 385 is established over the area of the transistor 200 that is most susceptible to the overetch problem. In this regard, the step of patterning the mask layer 370 may be understood by referring now to FIGS. 7 and 8, which are highly simplified plan views of the layout of the transistor 200. The layout of the active area 235 is shown in solid line. The layout of the trench isolation is designated 390. The rectangularly shaped dashed box 400 illustrates the layout of the LI trench that will eventually be etched for the transistor 200. The layout 400 of the LI trench is selected so that the LI trench will not overlie the border (designated 392) between the active area 235 and the trench isolation 390. However, since the LI strap to be formed is designed for lateral routing, the layout 400 of the LI trench passes over the border (designated 394) between the active area 235 and the trench isolation 390. There will be a risk of overetch junction shorting at the border 394 even if the photolithographic process used to ultimately form the LI trench is perfectly aligned. If the photolithographic process is misaligned, as depicted in FIGS. 2 and 3, then there will also be a risk of overetch at the border 392. Accordingly, the area of the transistor 200 that is at particular risk to overetch problems is delineated by the cross-hatched area 420. The cross-hatched area 420 shown in FIG. 7 corresponds to the desired location for the opening 385 in the mask layer 370 shown in FIG. 6. The layout of the cross-hatched area 420 may be readily determined by first determining the layout of the active area 235 and the layout of the LI trench, as illustrated by the dashed box 400, and then determining the intersection of the layout of the active area 235 and the layout of the LI trench, as represented by the dashed box 400. The intersection of the two areas yields the cross-hatched area 420 as shown in FIG. 8.

Figure 7:
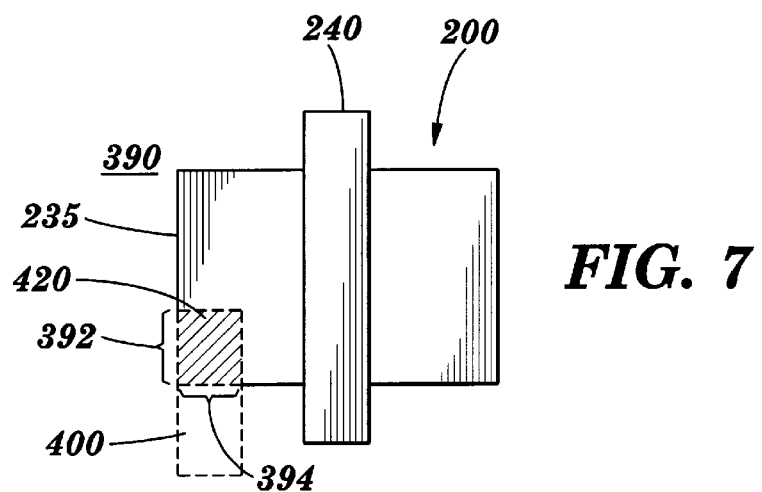
FIG. 7 is a plan view like FIG. 6 depicting the layouts of an active area and a local interconnect trench for the integrated circuit transistor in accordance with the present invention.
Figure 8:
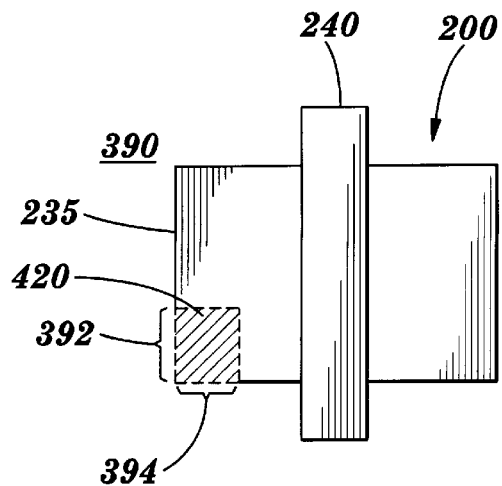
FIG. 8 is a plan view like FIG. 7 depicting the intersection of the layouts of the active area and the local interconnect trench for the integrated circuit transistor in accordance with the present invention.

The determination of the intersection of the layouts of the active area 235 and the LI trench, as represented by the dashed box 400 in FIG. 7, may be readily computed using the same layout tools used to layout the reticles for other structures in the transistor 200. As the person of ordinary skill in the art will appreciate, the layout of the active area 235 and the layout of the trench for the LI strap, as represented by the dashed box 400 in FIG. 7, are both established through the use of some type of layout tool used to computer generate the layouts of reticles for the transistor 200. Once the layouts of the active area 235 and the LI trench, as designated by the dashed box 400 in FIG. 7, have been determined by the layout designer, the determination of the intersection of the two areas, and thus the determination of the location of the opening 385 in the mask layer 370 shown in FIG. 6, is a matter of instructing the computer to compute the intersection of the active area 235 and the LI trench area 400. The determination of the intersection amounts to, in essence, computation of the logical AND of the active area layout 235 and the LI trench layout, as represented by the dashed box 400 in FIG. 7. The precise way in which the intersection is determined will depend upon the particular design tool used by the operator.

Referring again to FIG. 5, the second junction 380 is formed by ion implantation with the same dopant type, e.g. p-type or n-type, used to establish the source/drain regions 320 and 330. The ions pass through the opening 385 and penetrate the substrate 210. The implant dosage may be 1E14 to 2E15 ions/cm$^2$ and is advantageously 5E14 ions/cm$^2$ for $BF_2$. The implant energy may be 50 to 90 keV and is advantageously 75 keV for $BF_2$, or 60 to 90 keV and advantageously 75 keV for arsenic. The implant angle may be 0° or 7° and is advantageously 0°. The energy of the implants step will depend upon the number and type of layers that must be penetrated as well as the minimum feature size of the fabrication process.

Following establishment of the second junction 380, the substrate 210 is annealed to activate the source/drain regions 320 and 330. The anneal step may be accomplished in a rapid thermal process at approximately 1025 to 1075° C for approximately 30 seconds. The anneal is advantageously performed at approximately 1065° C for approximately 30 seconds.

Figure 9:
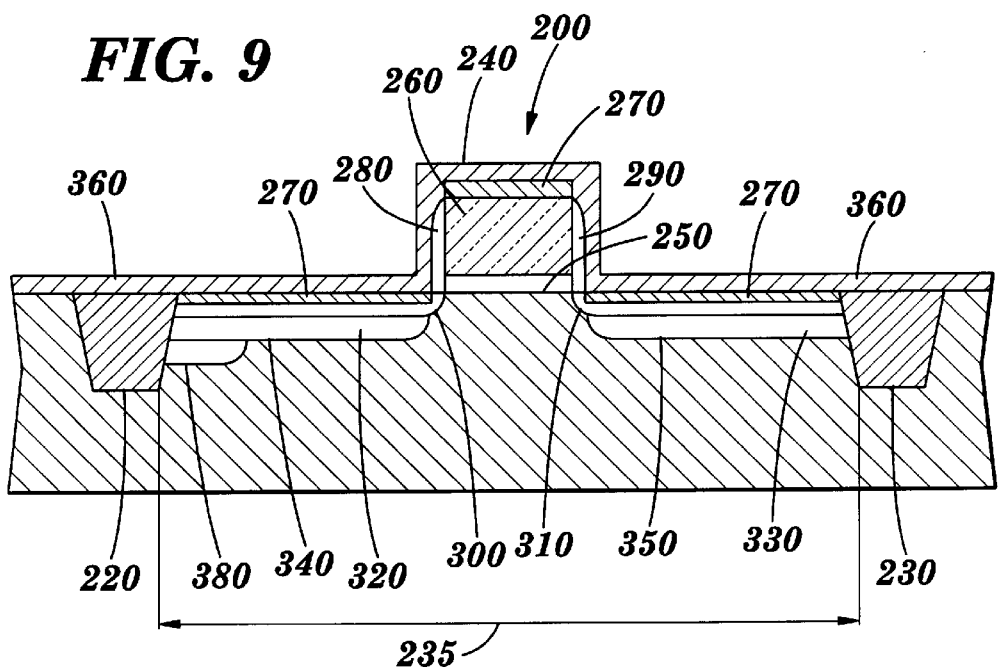
FIG. 9 is a cross-sectional view like FIG. 5 depicting removal of the mask layer in accordance with the present invention.

Referring now to FIG. 9, the mask layer 370 shown in FIG. 5 is stripped. The mask layer 370 may be stripped using a variety of well known photoresist stripping techniques. After the mask layer 370 is stripped, the salicide layer 270 is formed and the etch stop layer 360 is applied.

Figure 10:
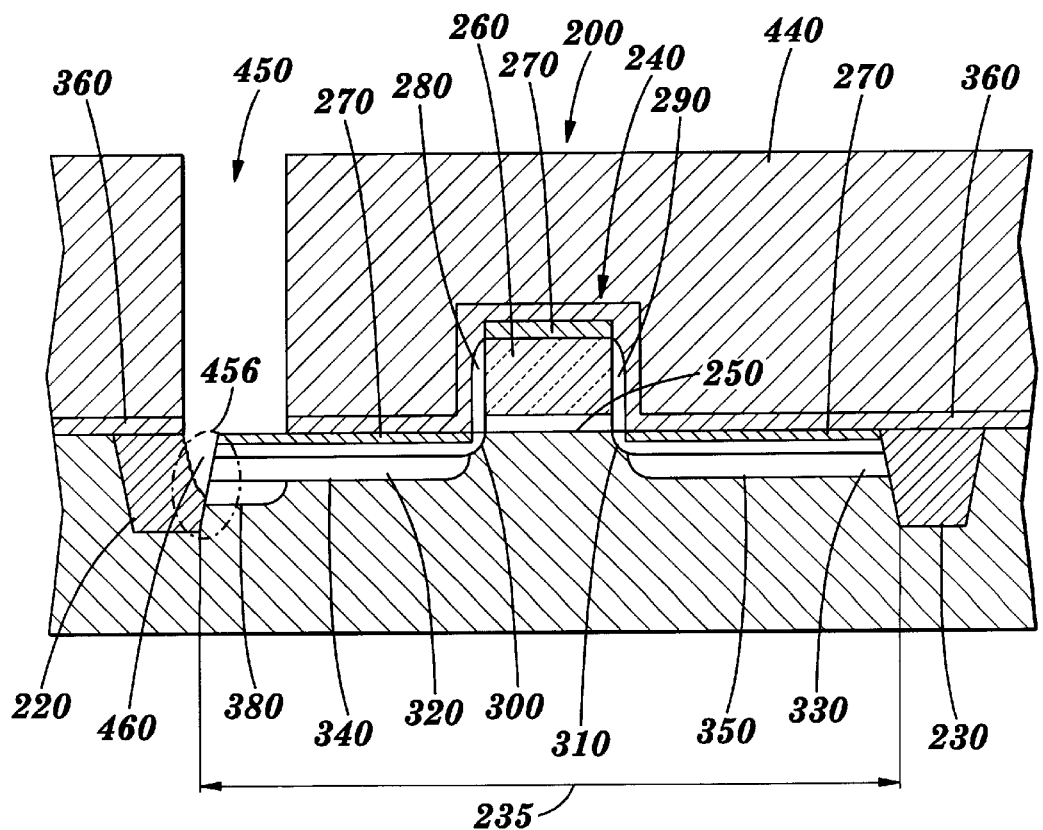
FIG. 10 is a cross-sectional view like FIG. 9 depicting application of a dielectric layer over the integrated circuit transistor and formation of the local interconnect trench in accordance with the present invention.
Figure 11:
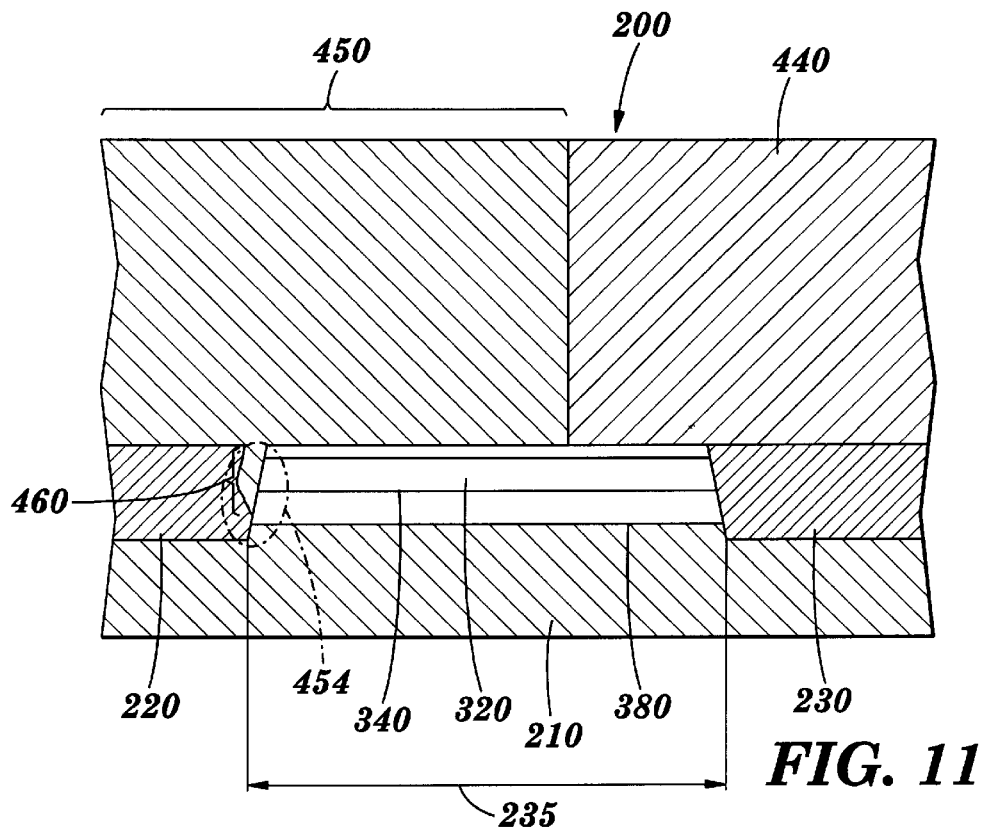
FIG. 11 is a cross-sectional view from the same general perspective as FIG. 3 and depicts application of a dielectric layer over the integrated circuit transistor and formation of the local interconnect trench in accordance with the present invention.

FIG. 10 and FIG. 11, which is a cross-sectional view of the transistor 200 of the type depicted in FIG. 3, depict the application of a dielectric layer 440 and the formation of a trench 450. The dielectric layer 440 is applied over the transistor 200 and planarized by chemical-mechanical-polishing ("CMP"). The layer 440 is then patterned to establish the LI trench 450 that extends downward to the etch stop layer 360. A plan view of the layout 400 of the LI trench 450 is shown in FIG. 7. The dielectric layer 440 may be composed of TEOS, spin-on-glass, BPSG, or other suitable interlevel dielectric materials, and is advantageously composed of TEOS. The dielectric layer 440 may be 1.0 to 1.5 μm thick and is advantageously 1.2 μm thick. The trench 450 may be formed by a variety of well known etching techniques, and is advantageously formed by reactive ion etching. Note that the trench 450 overlies the actual border 454 between the active area 235 and the isolation trench 220 as shown in FIG. 11. The actual border 454 is the physical implementation of the layout border 394 shown in FIG. 7. For the purposes of illustration, it is assumed that the position of the trench 450 is deviated from the layout 400 shown in FIG. 7 and overlies the actual border 456 between the active area 235 and the isolation trench 220 as a result of a photolithographic alignment error. The actual border 456 is the physical implementation of the layout border 392 shown in FIG. 7. Therefore, the trench 450 is formed with the same type of misalignment condition shown in FIGS. 2 and 3. It is further assumed that an overetch condition has occurred resulting in removal of the etch stop 360 in the trench 450, overetch of the isolation trench 220, and the formation of a void 460 in the isolation trench 220 at the borders 454 and 456.

Figure 12:
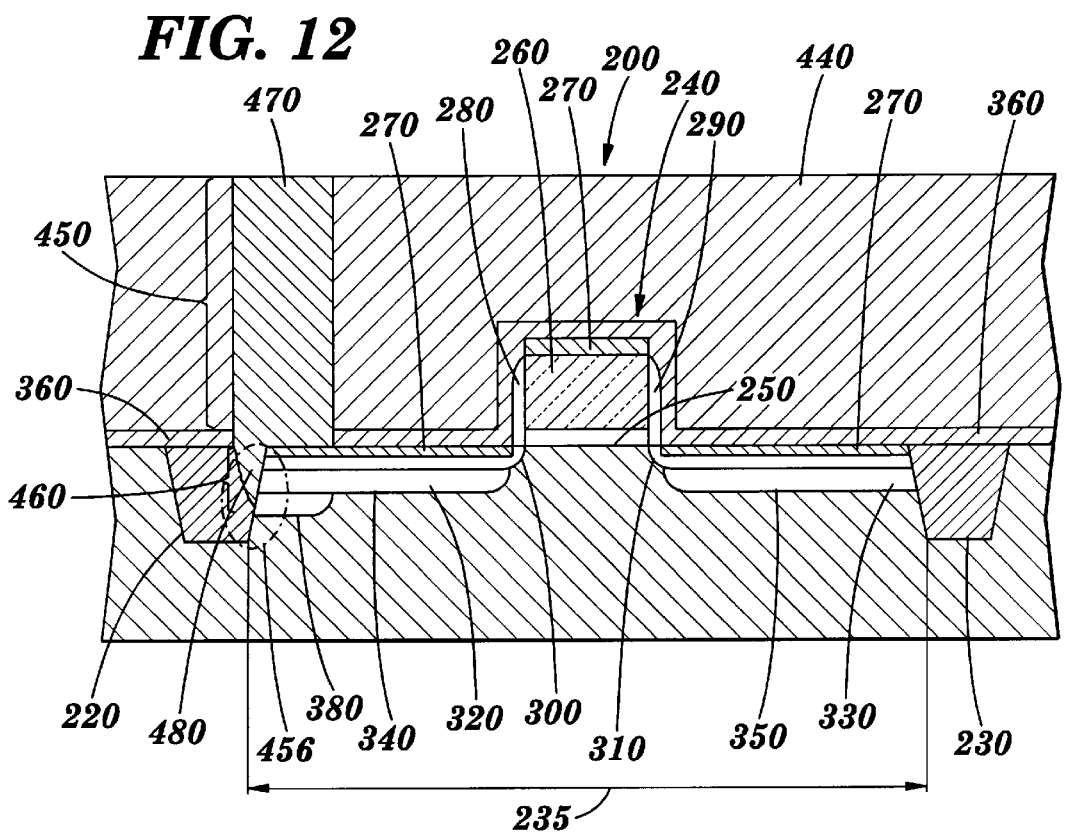
FIG. 12 is a cross-sectional view like FIG. 10 depicting deposition of a local interconnect strap in the trench in accordance with the present invention.
Figure 13:
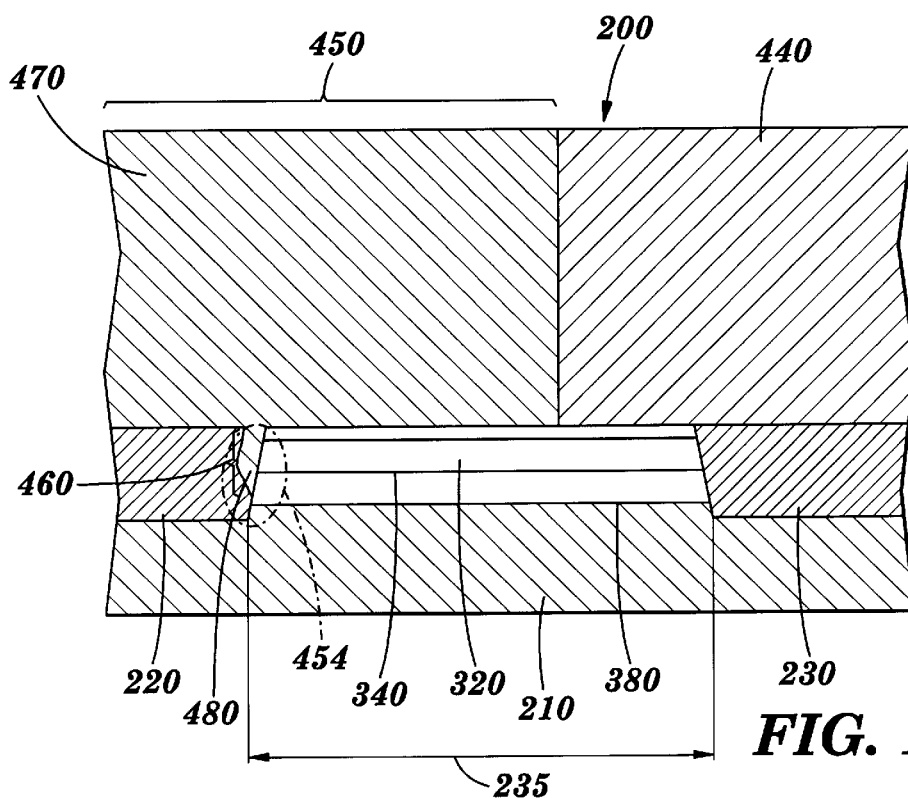
FIG. 13 is a cross-sectional view like FIG. 11 depicting deposition of a local interconnect strap in the trench in accordance with the present invention.

FIGS. 12 and 13 depict the views of FIGS. 10 and 11 following formation of a LI strap 470. The LI strap 470 is formed in the trench 450 by coating the trench 450 with sputter deposited titanium, coating the titanium layer with a layer of CVD TiN, and depositing tungsten by CVD. Tungsten, or other suitable materials commonly used to form local interconnects, may be used to form the strap 470. Following deposition of the tungsten, the strap 470 is planarized by CMP. In this illustration, the LI strap 470 fills the void 460, forming a conductor spike 480. The presence of this conductor spike 480 would short the junction 340 of the source/drain region 320 if the structure and techniques depicted in FIGS. 1, 2, and 3 were employed. However, the formation of the second junction 380 for the source/drain region 320 that is deeper than the first junction 340 provides a deeper region of protection against potential short circuiting due to overetch.

The foregoing illustrative embodiment of the present invention illustrates just one possible misalignment between the layout of the trench 450 and the source/drain region 320. The particular character of the misalignment is subject to great variation across the substrate 210. There may be larger, smaller, or no misalignments in other transistors in the substrate 210. By patterning the mask for the second junction 380 ion implant using the intersection of the layouts of the active area 235 and the LI trench 450, the second junction 380 is automatically established at the areas requiring overetch protection (e.g., the areas where the trench 450 overlies the borders between the active area 235 and surrounding trench isolation), regardless of the exact character of the misalignment. It is anticipated that the portion of the source/drain region 320 having the second junction will not be large enough relative to the source/drain region 320 to adversely impact the electrical performance of the transistor 200.

Figure 14:
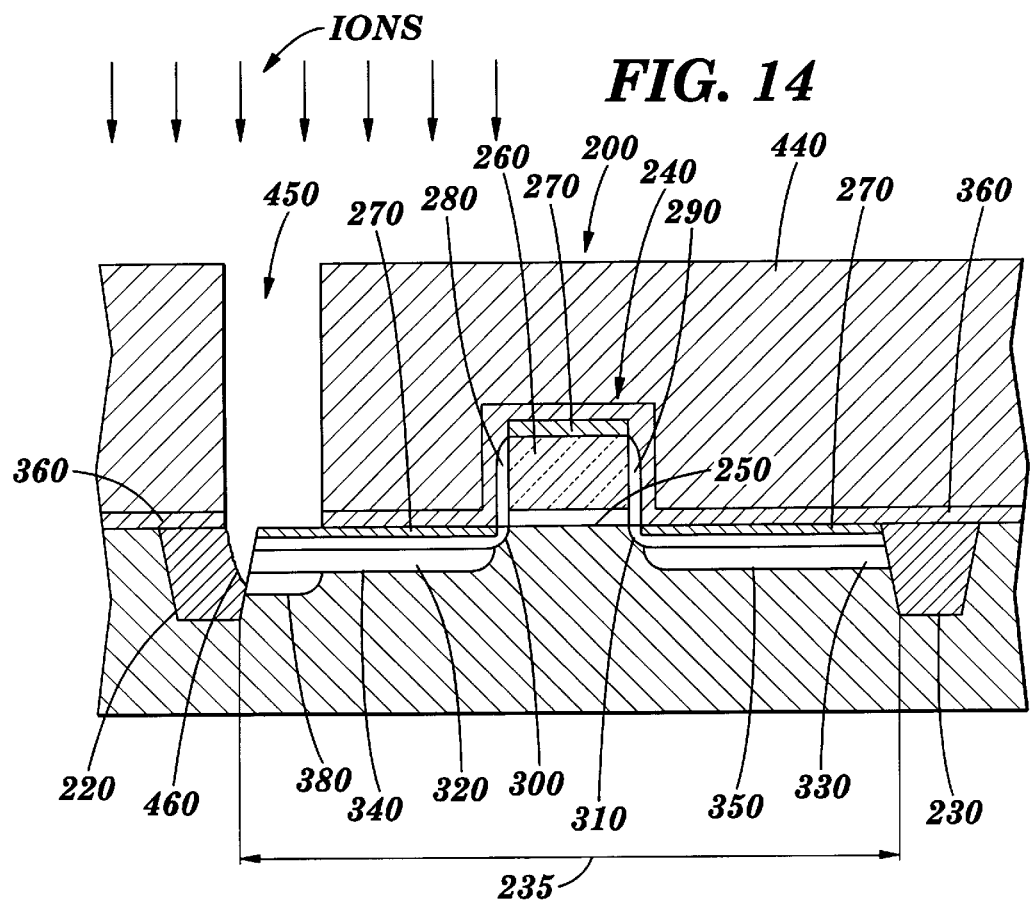
FIG. 14 is a cross-sectional view like FIG. 10 depicting an alternate embodiment of a integrated circuit transistor that utilizes a dielectric layer as a mask for ion implantation in accordance with the present invention.

In an alternate embodiment of the present invention depicted in FIG. 14, the ion implantation step used to establish the second junction 380 may be performed using the dielectric layer 440 as a hard mask. The person of ordinary skill in the art will appreciate that the layout of the trench 450 will, by definition, encompass the portion of the active area requiring establishment of the second junction 380. This concept is illustrated better in FIG. 7. The layout of the trench 450 is illustrated by the dashed box 400. The area requiring implantation to establish the second junction is delineated by the cross-hatched area 420. Ions implanted into the area represented by the dashed box 400 will, by necessity, also cover the cross-hatched area 420. Following the implant, the LI strap 470 may be deposited as illustrated in FIGS. 12 and 13. This method eliminates the mask application, patterning, and stripping steps depicted in FIGS. 5, 6, 7, 8, and 9.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating an integrated circuit transistor in a substrate for connection to a local interconnect in a trench, the substrate having an active area, comprising the steps of:

forming a gate electrode on the substrate;

forming a first source/drain region and a second source/drain region in the substrate, the first source/drain region having a first junction at a first depth in the substrate;

applying a mask to the substrate and patterning the mask to create an opening defined by the intersection of the layouts of the active area and the trench; and implanting a dopant species through the opening to provide the first source/drain region with a second junction that is deeper than the first junction.

2. The method of claim 1, comprising the steps of applying a dielectric layer to the substrate, forming the trench in the dielectric layer, and depositing a conducting material in the trench.

3. The method of claim 1, wherein the step of applying the mask comprises depositing a layer of photoresist.

4. The method of claim 1, wherein the step of forming the first and second source/drain regions comprises implanting the dopant species into the substrate.

5. A method of making a source/drain region in an integrated circuit transistor in a substrate for connection to a local interconnection in a trench, the substrate having an active area, comprising the steps of:

implanting a first dopant of a first dopant type into the active area to establish the source/drain region, the source/drain region having a first junction at a first depth in the substrate;

applying a mask to the substrate and patterning the mask to create an opening in the mask defined by the intersection of the layouts of the active area and the trench; and implanting a second dopant of the first dopant type into the substrate through the opening to provide the source/drain region with a second junction that is deeper than the first junction.

6. The method of claim 5, comprising the steps of applying a dielectric layer to the substrate, forming the trench in the dielectric layer, and depositing a conducting material in the trench.

7. The method of claim 5, wherein the step of applying the mask comprises depositing a layer of photoresist.

8. A method of fabricating a local interconnect in a trench for a semiconductor device having a source/drain region of a first dopant type with a first junction depth in a substrate having an active area, comprising the steps of:

applying a mask to the semiconductor device and patterning the mask to create an opening defined by the intersection of the layouts of the active area and the trench;

implanting a dopant species of the first dopant type into the substrate through the opening to define a second junction for the source/drain region having a second depth greater than the first junction depth;

applying a dielectric layer to the substrate;

forming the trench in the dielectric layer; and depositing a conducting material in the trench.

9. The method of claim 8, wherein the step of applying the mask comprises applying photoresist to the substrate.

10. The method of claim 8, wherein the step of applying a dielectric layer comprises depositing TEOS on the substrate.

11. The method of claim 8, wherein the step of depositing a conducting material comprises depositing tungsten by a chemical vapor deposition process.

* * * * *